United States Patent
Veda et al.

(10) Patent No.: US 12,001,973 B2
(45) Date of Patent: Jun. 4, 2024

(54) MACHINE LEARNING-BASED ADJUSTMENTS IN VOLUME DIAGNOSIS PROCEDURES FOR DETERMINATION OF ROOT CAUSE DISTRIBUTIONS

(71) Applicant: Siemens Industry Software Inc., Plano, TX (US)

(72) Inventors: Gaurav Veda, Hillsboro, OR (US); Wu-Tung Cheng, Lake Oswego, OR (US); Manish Sharma, Wilsonville, OR (US); Huaxing Tang, Wilsonville, OR (US); Yue Tian, Wilsonville, OR (US)

(73) Assignee: Siemens Industry Software Inc., Plano, TX (US)

( * ) Notice: Subject to any disclaimer, the term of this patent is extended or adjusted under 35 U.S.C. 154(b) by 861 days.

(21) Appl. No.: 16/361,915

(22) Filed: Mar. 22, 2019

(65) Prior Publication Data

US 2020/0302321 A1    Sep. 24, 2020

(51) Int. Cl.
  *G06N 7/01*        (2023.01)
  *G06F 30/367*      (2020.01)
  *G06N 20/00*       (2019.01)

(52) U.S. Cl.
  CPC ............. *G06N 7/01* (2023.01); *G06F 30/367* (2020.01); *G06N 20/00* (2019.01)

(58) Field of Classification Search
  CPC ...... G06N 7/005; G06N 20/00; G06F 30/367; G06F 30/27; G06F 30/333; G01R 31/2894; G01R 31/318566
  See application file for complete search history.

(56) References Cited

U.S. PATENT DOCUMENTS

| | | |
|---|---|---|
| 6,327,687 B1 | 12/2001 | Rajski et al. |
| 6,353,842 B1 | 3/2002 | Rajski et al. |
| 6,539,409 B2 | 3/2003 | Rajski et al. |
| 6,543,020 B2 | 4/2003 | Rajski et al. |

(Continued)

OTHER PUBLICATIONS

Cheng et al., Volume Diagnosis Data Mining, 2017 22nd IEEE European Test Symposium (ETS), 10 pages (Year: 2017).*

(Continued)

*Primary Examiner* — Li B. Zhen
*Assistant Examiner* — William Wai Yin Kwan

(57) ABSTRACT

A computing system may include a model training engine configured to train a supervised learning model with a training set comprising training probability distributions computed for training dies through a local phase of a volume diagnosis procedure. The computing system may also include a volume diagnosis adjustment engine configured to access a diagnosis report for a given circuit die that has failed scan testing and compute, through the local phase of the volume diagnosis procedure, a probability distribution for the given circuit die from the diagnosis report. The volume diagnosis adjustment engine may also adjust the probability distribution into an adjusted probability distribution using the supervised learning model and provide the adjusted probability distribution for the given circuit die as an input to a global phase of the volume diagnosis procedure to determine a global root cause distribution for multiple circuit dies that have failed the scan testing.

17 Claims, 6 Drawing Sheets

(56) References Cited

U.S. PATENT DOCUMENTS

| | | |
|---|---|---|
| 6,557,129 B1 | 4/2003 | Rajski et al. |
| 6,684,358 B1 | 1/2004 | Rajski et al. |
| 6,708,192 B2 | 3/2004 | Rajski et al. |
| 6,829,740 B2 | 12/2004 | Rajski et al. |
| 6,874,109 B1 | 3/2005 | Rajski et al. |
| 7,093,175 B2 | 8/2006 | Rajski et al. |
| 7,111,209 B2 | 9/2006 | Rajski et al. |
| 7,260,591 B2 | 8/2007 | Rajski et al. |
| 7,263,641 B2 | 8/2007 | Rajski et al. |
| 7,478,296 B2 | 1/2009 | Rajski et al. |
| 7,493,540 B1 | 2/2009 | Rajski et al. |
| 7,500,163 B2 | 3/2009 | Rajski et al. |
| 7,506,232 B2 | 3/2009 | Rajski et al. |
| 7,523,372 B2 | 4/2009 | Rajski et al. |
| 7,653,851 B2 | 1/2010 | Rajski et al. |
| 7,788,561 B2 | 8/2010 | Huang et al. |
| 8,316,265 B2 | 11/2012 | Guo et al. |
| 8,615,695 B2 | 12/2013 | Guo et al. |
| 8,689,070 B2 | 4/2014 | Huang et al. |
| 8,843,796 B2 | 9/2014 | Cheng et al. |
| 8,930,782 B2 | 1/2015 | Benware |
| 9,086,459 B2 | 7/2015 | Guo et al. |
| 9,703,658 B2 | 7/2017 | Schuermyer et al. |
| 2006/0066339 A1* | 3/2006 | Rajski ............... G01R 31/2846 324/762.02 |

OTHER PUBLICATIONS

Benware et al., Determining a Failure Root Cause Distribution From a Population of Layout-Aware Scan Diagnosis Results, IEEE Design & Test of Computers, 2012, pp. 8-18 (Year: 2012).*

J. Rajski, J. Tyszer, M. Kassab, and N. Mukherjee, "Embedded deterministic test," IEEE Trans. CAD, vol. 23, pp. 776-792, May 2004.

T. Bartenstein, D. Heaberlin, L.Huisman and D. Sliwinski, "Diagnosing Combinational Logic Designs using the Single Location At-ATime(SLAT) Paradigm," International Test Conference, 2001, pp. 287-296.

S. Venkataraman and S. B. Drummonds, "Poirot: A Logic Fault Diagnosis Tool and Its Applications", in Proc. of Intl. Test Conf., pp. 253-262, 2000.

R. Desineni, O. Poku, and R. D. Blanton, "A Logic Diagnosis Methodology for Improved Localization and Extraction of Accurate Defect Behavior," International Test Conference, 2006, pp. 1-10.

M. Sharma, S. Schwarz, J. Schmerberg, K. Yang, T.-P. Tai, Y.-S. Chen, C.-Y. Chuang, F.-M. Kuo, M. Brennan, J. Yeh and A. Ma, "Layout-Aware Diagnosis Leads to Efficient and Effective Physical Failure Analysis," ISTFA 2011, Proceedings from the 37th Int Symposium for Testing and Failure Analysis, Nov. 13-17, 2011, San Jose, CA, USA, pp. 86-90.

E. Amyeen, D. Nayak, and S. Venkataraman, "Improving Precision Using Mixed-level Fault Diagnosis," International Test Conference, 2006, pp. 1-10.

X. Fan, M. Sharma, W.- T. Cheng, and S. M. Reddy, "Diagnosis of Cell Internal Defects with Multi-cycle Test Patterns," Asian Test Symposium 2012, pp. 7-12.

F. Hapke, M. Reese, J. Rivers, A. Over, V. Ravikumar, W. Redemund, A. Glowatz, J. Schloeffel, and J. Rajski, "Cell-Aware Production Test Results from a 32-nm Notebook Process," International Test Conference, paper 1.1, 2012, pp. 1-9.

H. Tang, B. Benware, M. Reese, J. Caroselli, T. Herrmann, F. Hapke, R. Tao, W.-T. Cheng, and M. Sharma, "Diagnosing Cell Internal Defects Using Analog Simulation-based Fault Models," Asian Test Symposium, 2014, pp. 318-323.

H. Tang, M. Sharma J. Rajski, M. Keim, and B. Benware, "Analyzing Volume Diagnosis Results with Statistical Learning for Yield Improvement," in Proc. of European Test Symp., pp. 145-150, 2007.

M. Sharma, C. Schuermyer, and B. Benware, "Determination of Dominant-Yield-Loss Mechanism with Volume Diagnosis," in IEEE Design & Test of Computers, pp. 2-9, May/Jun. 2010.

B. Benware, C. Schuermyer, M. Sharma and T. Hermann, "Determining a Failure Root Cause Distribution from a Population of Layout-Aware Scan Diagnosis Results", in IEEE Design & Test of Computers, pp. 8-18, 2012.

W.T. Cheng, Y. Tian, and S.M. Reddy. "Volume diagnosis data mining." in Proc. of European Test Symp., pp. 1-10, 2017.

Y. Pan, A. Chittora, K. Sekar, G. S. Huat, Y. G. Feng, A. Viswanatha and J. Lam, "Leveraging Root Cause Deconvolution Analysis for Logic Yield Ramping", in Proc. of Intl. Symp. of Testing and Failure Analysis, ISTFA 2013: Conf Proceedings from the 39th Int Symposium for Testing and Failure Analysis, 7 pages, Nov. 2013.

C. Schuermyer, S. Malik, and T. Herrmann, "Identifying systematic critical features using silicon diagnosis data", ASMC 2012, pp. 1-6, 2012.

R. D. Blanton, F. Wang, C. Xue, PK Nag, Y. Xue, and X. Li, "DREAMS: DFM Rule Evaluation using Manufactured Silicon", 2013. pp. 99-106.

W.T. Cheng et al., "Automatic Identification of Yield Limiting Layout Patterns Using Root Cause Deconvolution on Volume Scan Diagnosis Data", IEEE 26th Asian Test Symposium, 2017, pp. 214-219.

W. C. Tam, and R. D. Blanton, "Physically-Aware Analysis of Systematic Defects in Integrated Circuits," International Test Conference, paper 4.2, 2011, pp. 1-10.

G. Casella and R. Berger, "Statistical Inference", Second Edition, Duxbury Resource Center, 2001. Theorems 1.2.11 a, pp. 11-13 and 10.1.6, pp. 470-472.

D. A. Schum, "The Evidential Foundations of Probabilistic Reasoning", Northwestern University Press, 1994. p. 49, https://books.google.com/books?id=8PqsTNULCPEC&pg=PA49&source=gbs_toc_r&cad=4#v=onepage&q&f=false.

R. H. Byrd, P. Lu, J. Nocedal, and C. Zhu "A Limited Memory Algorithm for Bound Constrained Optimization," SIAM Journal on Scientific and Statistical Computing, 16, 5, pp. 1190-1208, 1995.

B. Boyd and L. Vandenberghe, "Convex Optimization", Cambridge University Press, 2004, Section 3.2, pp. 79-90.

C. Bishop, "Pattern Recognition and Machine Learning", Springer-Verlag, 2006, Chapter 9—Mixture Models and EM, pp. 423-459.

M. Mohri, A. Rostamizadeh and A. Talwalkar, "Foundations of Machine Learning", The MIT Press, 2012, 22 pgs.

L. Breiman, "Random Forests" 33 pages, Jan. 2001.

* cited by examiner

MACHINE LEARNING-BASED ADJUSTMENTS IN VOLUME DIAGNOSIS PROCEDURES FOR DETERMINATION OF ROOT CAUSE DISTRIBUTIONS

BACKGROUND

Electronic circuits, such as integrated circuits, are used in nearly every facet of modern society, from automobiles to microwaves to personal computers. Identification of root causes for defects in manufactured circuits may improve the yield of circuit fabrications.

BRIEF DESCRIPTION OF THE DRAWINGS

Certain examples are described in the following detailed description and in reference to the drawings.

DETAILED DESCRIPTION

Figure 1:
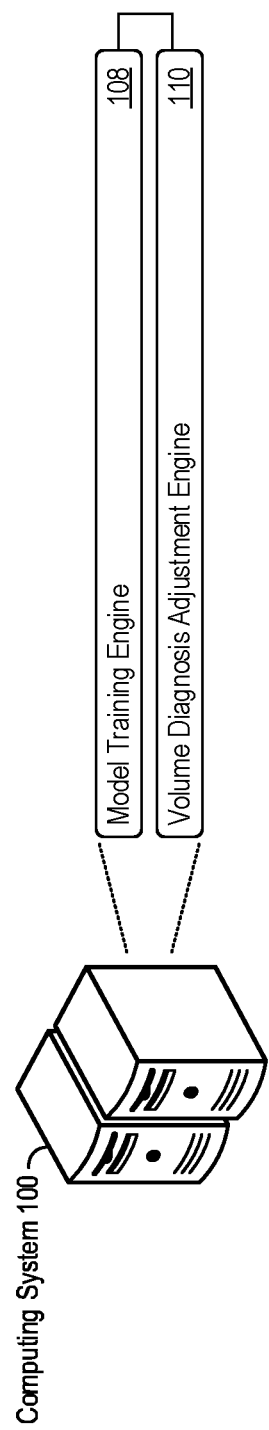
FIG. 1 shows an example of a computing system that supports supervised machine learning ("ML")-based adjustments in volume diagnosis procedures for determination of root cause distributions in circuit manufacture.

Modern integrated circuits ("ICs") have become increasingly complex. At some technology nodes, feature sizes have shrunk to a few atoms wide. In efforts to achieve higher performance and lower power consumption, non-planar or "3D" FinFET transistors have been used in circuit design and manufacture. As compared to conventional transistors, FinFET transistors and corresponding transistor connections have more complicated structures with additional layers, and often require additional process steps to manufacture. Increased circuit complexity and increased number of process steps can result in additional root causes of defects in IC manufacture. Consequently, transistor-related root causes are becoming increasingly prevalent, limiting the manufacturing yield of ICs. As used herein, transistor-related or library cell-related defects and root causes are referred to as "cell-internal" defects and root causes. IC manufacture at high volumes with high yield is an increasingly difficult challenge for chip designers and foundries, and accurately identifying yield-limiting root causes can improve IC manufacture yields.

Scan tests provide a mechanism to test digital logic in ICs. Diagnosis procedures may utilize scan test failure data obtained for failed ICs as well as circuit design information in order to identify defect locations that cause a manufactured IC to fail. However, diagnosis results have an inherent ambiguity. Different defects can be logically equivalent under applied scan test patterns and a diagnosis tool's defect models. As such, more than one defect can produce the same failure data and diagnosis report, and a single failed IC can contain multiple candidate defect locations and multiple defect mechanisms. Diagnosis ambiguity can be reduced or eliminated via volume diagnosis procedures, which may be performed via statistical analysis on a collection of diagnosis reports for failed ICs. Volume diagnosis procedures may identify a set of common physical defect features or root causes, e.g., in both local phases (for failed ICs individually) or in a global phase (for a population of failed ICs). Example root causes include open and bridge root causes for interconnect metal layers, open root causes for interconnect via layers, mismatched via types, open and bridge root causes for layer inside the cell (e.g. contacts to poly), inter-layer bridge root causes within the cell, deficient layout patterns, violation of design for manufacture (DFM) rules, etc.

Many volume diagnosis procedures use consensus between various failing circuits to eliminate defect candidates that are less likely to have caused the circuits to fail. To illustrate, a volume diagnosis procedure may determine that failure data for a particular IC can be attributed to either an open in a metal 2 layer ($Open_{M2}$) or due to an open in the contact to diffusion layer ($Open_{CoD}$). In this illustration, the $Open_{CoD}$ candidate defect is also a viable explanation for a relatively large number of other failed ICs with the same circuit design, whereas $Open_{M2}$ can be attributed as a defect candidate to only a few other failed ICs. As such, for the particular failed IC, a volume diagnosis-based procedure may determine a higher probability for the $Open_{CoD}$ defect having caused the particular IC to fail, as compared to a determined defect probability for the $Open_{M2}$ defect. In some cases, a volume diagnosis procedure may completely eliminate $Open_{M2}$ as a candidate defect.

In some implementations, volume diagnosis procedures involve two phases. In a local phase, a volume diagnosis procedure may operate on a single failing circuit (e.g., a circuit die that has failed scan testing), doing so to determine a probability distribution of the circuit failing due to different root causes. In a global phase, the volume diagnosis procedure may combine information (e.g., probability distributions) from a population of failed circuits, e.g., as gathered from a particular circuit wafer, wafer sets, production or test runs, etc. In doing so, the volume diagnosis procedure may analyze multiple failed dies in volume, applying statistical analysis techniques to identified defect patterns and individual die probabilities in the failed die population to determine a global root cause distribution for the failed circuit dies.

The features described herein may provide supervised ML-based adjustments to volume diagnosis procedures. In particular, the ML-based volume diagnosis adjustment features described herein may modify a local phase of volume diagnosis procedures to adjust probability distributions determined for individual failed circuit dies. The adjusted probability distributions may provide increased accuracy in determination of global root cause distributions in a global phase. In some instances, a supervised learning model may be trained with training sets of training die labeled with actual root causes injected into the training die. In effect, the supervised learning model may improve the performance of a local phase of volume diagnosis procedures by tuning/adjusting a local phase outputs based on analyzed training data. In doing so, the ML-based volume diagnosis adjustment features described herein may improve the accuracy of root cause determinations, which may ultimately improve circuit manufacture yields.

These and other ML-based volume diagnosis adjustment features and technical benefits are described in greater detail herein.

FIG. 1 shows an example of a computing system 100 that supports ML-based adjustments in volume diagnosis procedures for determination of root cause distributions in circuit manufacture. The computing system 100 may include a single or multiple computing devices such as application servers, compute nodes, data servers, desktop or laptop computers, smart phones or other mobile devices, tablet devices, embedded controllers, and more.

As described in greater detail herein, the computing system 100 may utilize supervised ML techniques to adjust a volume diagnosis procedure. For instance, the computing system 100 may train a supervised learning model, doing so with a training set generated from training dies injected with defects attributable to selected root causes. The injected defects may cause the training dies to fail scan testing. The output of a local phase of the volume diagnosis procedure (e.g., computed probability distributions for the training dies) may be labeled with the actual root cause injected in each given training die, by which the supervised learning model can characterize and tune local phase outputs to increase accuracy of global root cause determinations.

To apply a trained supervised learning model, the computing system 100 may access failed circuit dies (e.g., from a manufacture run at a foundry) and compute probability distributions for the failed circuit dies. Then, the computing system 100 may apply the supervised ML model to adjust the computed probability distributions and then use the adjusted probability distributions in a global phase of a volume diagnosis procedure. By adjusting the computed probability distributions via the supervised learning model, the computing system 100 may support global root cause distribution determinations with increased accuracy.

To implement any of the various ML-based volume diagnosis adjustment features described herein, the computing system 100 may include a model training engine 108 and a volume diagnosis adjustment engine 110. The computing system 100 may implement the model training engine 108 and volume diagnosis adjustment engine 110 (and components thereof) in various ways, for example as hardware and programming implemented via local resources of the computing system 100. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engine components or system elements using the same computing system features or hardware components (e.g., a common processor or common storage medium for the model training engine 108 and the volume diagnosis adjustment engine 110).

In operation, the model training engine 108 may train a supervised learning model with a training set comprising training probability distributions computed for training dies, doing so through a local phase of a volume diagnosis procedure. Each given training probability distribution may specify probabilities for different root causes as having caused a given training die to fail as computed by the volume diagnosis procedure, and each given training probability distribution may be labeled with an actual root cause that caused the given training die to fail.

In operation, the volume diagnosis adjustment engine 110 may access a diagnosis report for a given circuit die that has failed scan testing and compute, through the local phase of the volume diagnosis procedure, a probability distribution for the given circuit die from the diagnosis report. The probability distribution may specify probabilities for different root causes as having caused the given circuit die to fail. The volume diagnosis adjustment engine 110 may also adjust the probability distribution into an adjusted probability using the supervised learning model and provide the adjusted probability for the given circuit die as an input to a global phase of the volume diagnosis procedure to determine a global root cause distribution for multiple circuit dies that have failed the scan testing.

These and other examples of ML-based volume diagnosis adjustment features are described in greater detail next. In some of the examples described herein, various ML-based volume diagnosis adjustment features are described with reference root cause deconvolution ("RCD"), which is one example of a volume diagnosis procedure. However, any of the ML-based volume diagnosis adjustment features described herein may be consistently implemented for any other volume diagnosis procedures as well.

Figure 2:
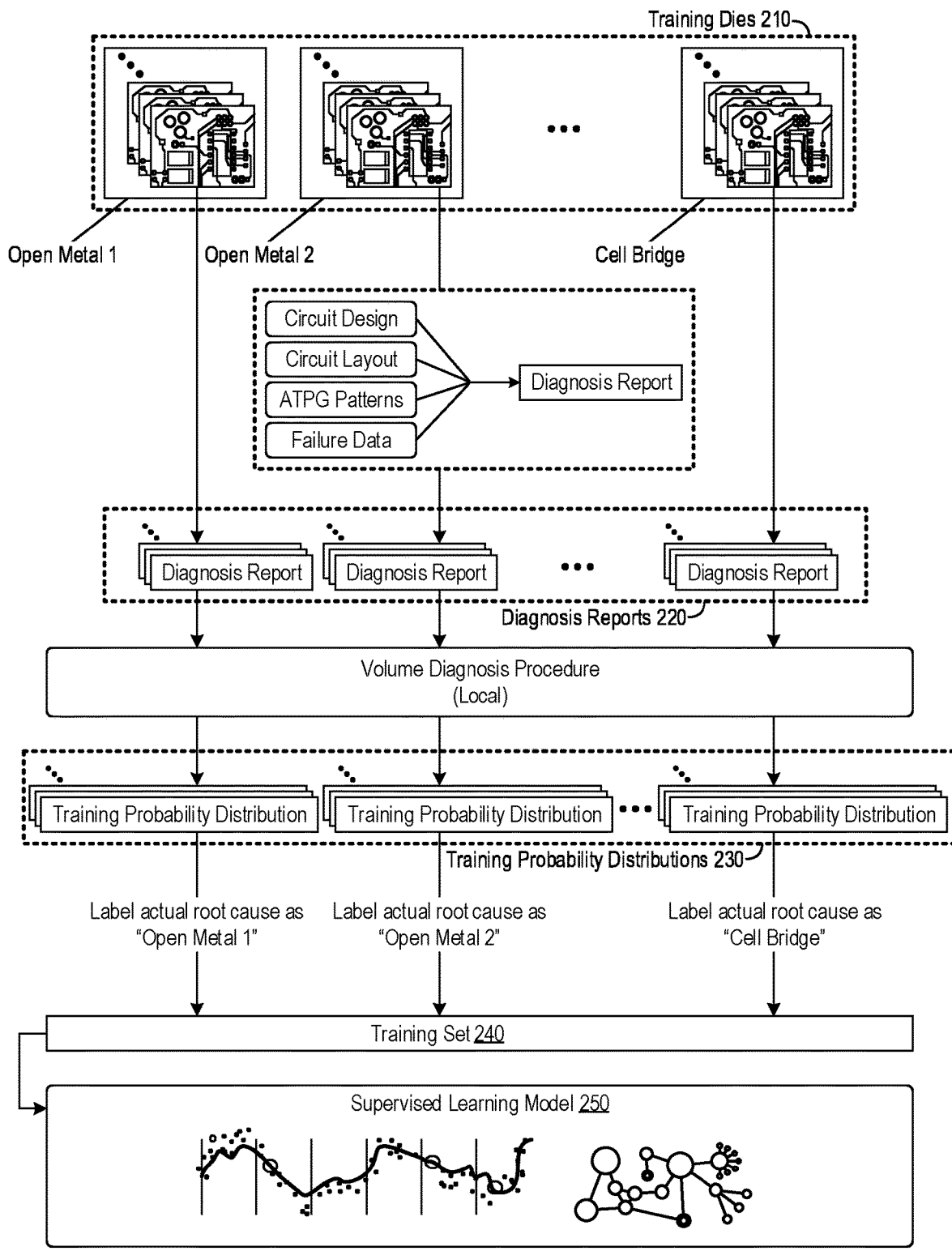
FIG. 2 shows an example training of a supervised learning model that supports ML-based volume diagnosis adjustments.

Before turning to FIG. 2, RCD is described to aid in the understanding of the ML-based volume diagnosis adjustment features disclosed herein. Various RCD features are also described in U.S. Pat. No. 8,930,782 titled "Root Cause Distribution Determination based on Layout Aware Scan Diagnosis Results" and issued on Jan. 6, 2015 ("the '782 patent"), which is incorporated herein by reference in its entirety. RCD features are also described in "Determining a Failure Root Cause Distribution From a Population of Layout-Aware Scan Diagnostic Results," by Brady Benware, Chris Schuermyer, Manish Sharma, and Thomas Herrmann, *IEEE Design & Test of Computers*, p. 8-18, February 2012 ("the IEEE RCD publication"), also incorporated herein by reference in its entirety.

As described in the '782 patent and the IEEE RCD publication, volume diagnosis procedures such as RCD may analyze diagnosis reports to determine possible root causes for failed circuit dies. Layout aware diagnosis may involve analyzing multiple factors (such as circuit design, circuit layout, test patterns, and failure data) to generate a diagnosis report that lists suspected or candidate defects, critical circuit areas, and other failure-related data with regards to a failed circuit device. Such analysis may be represented or provided through a diagnosis report, which may include or refer to any failure data with respect to a failed circuit die.

RCD may utilize unsupervised learning techniques to model diagnosis reports of failing circuit dies via a Bayesian network. A diagnosis report for a single device often contains multiple candidate defects and their associated root causes. When defects in a diagnosis report are mutually exclusive, $P(r_i)$ may specify the probability of a given diagnosis report $r_i$. In reference to volume diagnosis procedures, $P(r_i)$ can be represented as the following:

$$P(r_i) = \Sigma(P(r_i|d_j) * P(d_j))$$

where $P(d_j)$ represents the probability of defect $d_j$ in a diagnosis report and $P(r_i|d_j)$ represents the conditional probability of report $r_i$ if the specific defect $d_j$ occurs. The above equation sums up all the defects in a diagnosis report. In a consistent manner, if all root causes of one defect are mutually exclusive, then $P(d_j)$ can be represented as the following:

$$P(d_j) = \Sigma(P(d_j|c_n) * P(c_n))$$

where $P(c_n)$ represents the probability of root cause $c_n$ and $P(d_j|c_n)$ represents the conditional probability of defect $d_j$ if root cause $c_n$ occurs. This equation may sum up all the associated root causes of defect $d_j$. Combining these two equations, the Bayesian network of diagnosis report $r_i$ can be represented as:

$$P(r_i)=\Sigma(P(r_i|d_j)*(\Sigma(P(d_j|c_n)*P(c_n))))).$$

This equation can be simplified as the following:

$$P(r_i)=\Sigma(P(r_i|c_n)*P(c_n))$$

in which:

$$P(r_i|c_n)=\Sigma(P(r_i|d_j)*P(d_j|c_n))$$

In particular, $P(r_i|c_n)$ may represent the probability of a diagnostic report $r_i$, given a root cause $c_n$. Understood in a different way, $P(r_i|c_n)$ may (in effect) represent a probability that a given root cause as having caused a given circuit die to fail, as computed for a given diagnosis report $r_i$. In some implementations, $P(r_i|c_n)$ (or more generally $P(r|c_n)$, as specified for a general diagnosis report r) may be represented as a vector of probabilities, with a number of dimensions equal to a number of root causes tracked by RCD or any volume diagnosis procedure for a given circuit design. In effect, each dimension of such a probability vector may represent the probability a given root cause $c_n$ has actually caused a given circuit die with diagnosis report r to fail.

With volume diagnosis procedures like RCD (and assuming all diagnosis reports from a population of failing circuit dies are independent), the probability of all reports can be represented as:

$$P(v)=\Pi(P(r_i)=\Pi(\Sigma(P(r_i|c_n)*P(c_n)))$$

RCD may utilize Maximum-Likelihood Estimation ("MLE") to find the distribution of P(c) of root causes which maximizes value of P(v). This implies that if (i) the probabilities of $P(r_i|c_n)$ are accurate and (ii) a sufficiently large sample population of failed circuit dies exists, MLE may determine an underlying root cause distribution P(c) with increased or complete accuracy.

Accordingly, one way to improve the performance of RCD (and other volume diagnosis procedures) is to increase the accuracy $P(r_i|c_n)$. As denoted in the equations above, the accuracy of $P(r_i|c_n)$ depends on the accuracies of $P(r_i|d_j)$ and $P(d_j|c_n)$. Intuitively, $P(r_i|d_j)$ should be 1 since each defect should cause one specific failure data and one specific diagnosis report. However, due to the complexity of circuit design and manufacturing processes, failure data of some circuits may not match the modeled behavior of any defect.

Moreover, the local phase of RCD computations may make assumptions that may not be entirely correct. For instance, to avoid unsuccessful diagnosis, RCD may allow some defects to have multiple behaviors. Such variation may depend on defect location, test conditions, and other factors. For some root causes, RCD may determine the conditional probability $P(d_j|c_n)$ as either proportional to the critical area of defect behavior (e.g., opens and shorts in interconnects and inside cells), or that each defect instance is equally likely (e.g., layout pattern related defects). Due to complex defect behavior in advanced technologies, such assumptions may not be entirely correct, thus reducing the accuracy of subsequent global root cause distribution determinations in a global phase.

With this discussion of RCD in mind, the ML-based volume diagnosis adjustment features disclosed herein may provide an approach for determining probability distributions for individual failed circuit dies given a diagnosis report (e.g., as represented by $P(r|c_n)$) with increased accuracy. Supervised ML techniques may be effectively used to, in effect, learn correlations between defect behavior of specific root causes and diagnosis reports with increased precision and accuracy. The use of supervised learning methods at an individual diagnosis report level (that is, a local phase of a volume diagnosis procedure), followed by using unsupervised learning methods (e.g. RCD) at the volume level, may provide increased accuracy in determination of root cause distributions in a population of failed circuit dies. Described next with reference to FIG. 2 are example features using supervised ML techniques to train a model to adjust volume diagnosis procedures at a local phase.

FIG. 2 shows an example training of a supervised learning model that supports ML-based volume diagnosis adjustments. The model training features depicted in FIG. 2 are described as being performed by the model training engine 108 as a specific implementation example, though other implementations are possible.

The model training engine 108 may train supervised learning models to tune the local phase of volume diagnosis procedures to increase the accuracy at which defect probabilities for individual failed circuit dies are computed. Volume diagnosis procedures (such as RCD) may utilize an unsupervised learning model to compute probability distributions for given circuit dies, determine global root cause distributions for multiple failed circuit dies, or both. For instance, an RCD defect model may be used to perform the local and/or global phases in support of root cause distribution determinations. As described in greater detail herein, trained supervised learning models may adjust (e.g., correct) assumptions of a diagnosis procedure that affect the accuracy of local phase outputs (that is, increase the accuracy of $P(r|c_n)$). The model training engine 108 may train learning models via supervised ML techniques through use of labeled training sets.

The model training engine 108 may prepare a labeled training set in support of training supervised learning models. In FIG. 2, the model training engine 108 accesses the training dies 210. The training dies 210 may represent a population of dies selectively injected with varying defects attributable to different root causes. Accordingly, each training die may be injected with a given root cause (via a corresponding defect) to actually cause a scan test failure. The training dies 210 may include various dies injected with defects distributed across the training dies 210 by which trained models can characterize (and subsequently adjust) behavior of volume diagnosis procedures.

In some examples, the training dies 210 are selectively created according to different training parameters. One such training parameter may be a selected set of root causes to inject into the training dies 210. The selected set of root causes may be predetermined, and may include a list of mutually exclusive root causes which are responsible for the various (e.g., all) defects in a particular circuit design. Different circuit designs may vary in implementation and complexity, and some designs may result in an increased number of root causes that possibly afflict the circuit design. Accordingly, the predetermined root causes may be selected based on circuit design and layout factors of a given die being analyzed. Example root causes may include open metals in different layers (e.g., $Open_{M1}$, $Open_{M2}$, $Open_{M3}$, and $Open_{M4}$), short metals in different layers (e.g., $Short_{M1}$, $Short_{M2}$, $Short_{M3}$, and $Short_{M4}$), cell opens in different layers (e.g., $Open_{CoD}$, $Open_{CoP}$, $Open_{PS}$, and $Open_{VO}$), and cell bridges (e.g., $Bridge_{PS}$). A set of predetermined root causes may be provided to the model training engine 108, for example, via user input.

From a selected set of root causes, the model training engine 108 may determine a list of possible defects corresponding to each root cause. The model training engine 108 further compute the probability of each possible defect occurring, doing so for each root cause. Depending on a given root cause, the model training engine 108 may determine the probability as proportional to its critical area or, alternatively, that each defect instance is equally likely in probability. Then, to create the training dies 210, the model training engine 108 may sample (with replacement) from the defect distribution for each given root cause to generate a population of dies injected with the various defects consistent with the computed probabilities. The training dies 210 may result from such a sampling and are targeted to capture the variability in root cause behavior and diagnostic tool behavior for the root cause. To the extent possible, the model training engine 108 may generate the training dies 210 to include a variety of both interconnect and cell-internal defects for sampled root causes.

To illustrate through FIG. 2, the training dies 210 accessed by the model training engine 108 include multiple sets of training dies, each attributable to a corresponding root cause. As seen in FIG. 2, the training dies 210 include a die subset comprising training dies injected with an open metal 1 ("$Open_{M1}$") root cause (e.g., injected with a distribution of defects attributable to $Open_{M1}$), another die subset comprising training dies injected with an open metal 2 root cause, and yet another die subset comprising training dies injected with a cell bridge root cause. In some instances, the training dies 210 are generated, modeled, or otherwise accessed without physical fabrication of the training dies. In such instances, the training dies 210 may be represented via simulation or hardware emulation.

The model training engine 108 may track (e.g., simulate) operation of the training dies 210. For instance, the model training engine 108 may apply or run automatic test pattern generation (ATPG) patterns or other scan tests to test the training dies 210. In doing so, the model training engine 108 may obtain failure data for the training dies 210 (as each training die will fail, having been injected with a specifically selected root cause). For cell-internal defects injected into a given training die, the model training engine may utilize a SPICE model to simulate behavior. For interconnect defects injected into a given training die, the model training engine 18 may use logic fault simulation. As a result of such simulations, the model training engine 108 may obtain failure data for each given training die, including failure data for the particular defect of the given root cause injected into the training die.

For each training die, the model training engine 108 may generate a diagnosis report. The model training engine 108 may, for example, use a diagnosis tool to generate such a diagnosis report for a given training die, doing so based on various factors such as the circuit design, circuit layout, applied ATPG patterns, and failure data of the given training die. Example volume diagnosis procedures are described in in the '782 patent and the IEEE RCD publication, as well as "Diagnosing Cell Internal Defects Using Analog Simulation-based Fault Models," by H. Tang, B. Benware, M. Reese, J. Caroselli, T. Herrmann, F. Hapke, R. Tao, W.-T. Cheng, and M. Sharma, *Asian Test Symposium*, 2014, which is incorporated herein by reference in its entirety. In any of the ways described therein, the model training engine 108 may generate a diagnosis report for each of the training dies 210, shown in FIG. 2 as the diagnosis reports 220.

From the diagnosis reports 220, the model training engine 108 may compute a training probability distribution for each of the training dies 210. The model training engine 108 may do so via a local phase of a volume diagnosis procedure, such as RCD, and each of the computed training probability distributions may respectively correspond to one of the training dies 210. As described herein, each training probability distribution may specify probabilities for various different root causes as having caused a given training die to fail (as computed by the volume diagnosis procedure). For instance, a training probability distribution computed by the model training engine 108 may take the form of a vector of probabilities comprised of $P(r|c_n)$ values for each root cause in a given diagnostic report generated for a given training die. In FIG. 2, the computed training probability distributions are shown as the training probability distributions 230, and the training probability distributions 230 may represent an output of a local phase of a volume diagnosis procedure performed for the training dies 210.

The model training engine 108 may label each of the training probability distributions 230 with the given root cause injected into the training die for which the training probability distribution was subsequently computed. The labeled given root cause may be indicative of the actual root cause for the training probability distribution. Put another way, the model training engine 108 may label each training probability distribution with the actual root cause that resulted in the diagnosis report and corresponding training probability distribution. As seen in FIG. 2, the model training engine 108 may label actual root causes of $Open_{M1}$, $Open_{M2}$, Bridge, etc. for corresponding training probability distributions.

The labeled training probability distributions may form a training set 240 by which the model training engine 108 trains a supervised learning model, e.g., the supervised learning model 250 shown in FIG. 2. As such, the model training engine 108 may provide, as the training set 240, the labeled training probability distributions to train the supervised learning model 250. In other examples, the model training engine 108 may produce the training set 240 as a set of labeled diagnosis reports, doing so by labeling the diagnosis reports 220 with corresponding root causes that were injected into the training dies 210 from which the diagnosis reports 220 were respectively generated. In such examples, the training probability distributions 230 may be computed during application of supervised ML processes to train the supervised learning model 250.

The model training engine 108 may apply any number or combination of supervised ML algorithms to train the supervised learning model 250 with the training set 240. The goal of the applied supervised ML may be to obtain a more accurate estimate for $P(r|c_n)$ (the probability of a report, given a root cause, which may in turn represent the probability that a given root cause as having caused a given circuit die to fail). In some instances, the model training engine 108 trains the supervised learning model 250 as a custom classifier that takes the training data 240 as an input and determines an estimate for $P(r|c_n)$. This estimated probability may be subsequently used to support a more accurate global root cause distribution via a global phase of a volume diagnosis procedure. For reference, the estimated probabilities generated by the supervised learning model 250 may be denoted as $P_A(r|c_n)$.

In training the supervised learning model 250, the model training engine 108 may select specific input features to use from the diagnosis reports 220 and what ML model to use for building a classifier. Note for a report r, volume diagnosis procedures such as RCD already compute $P(r|c_n)$ for each root cause $c_n$. For the sake of clarity in discussing training of the supervised learning model 250, these probabilities generated by the local phase of a volume diagnosis procedure may be referred to as $P_O(r|c_n)$. In reference to FIG. 2, the training probability distributions 230 may comprise vectors of $P_O(r|c_n)$ values. In particular, the training model engine 108 may specifically use these computed probability values as the input features to the supervised ML algorithm(s) used to train the supervised learning model 250.

While some examples are presented above, any additional or alternative input features are also contemplated herein to, including any training sets prepared based upon the training probability distributions 230 (e.g., mathematical equivalents or computed sets) or other input features not based on the training probability distributions 230 that may otherwise distinguish root causes. Example input features through which the model training engine 108 may configure training data to train the supervised learning model 250 include, for a given diagnosis report, a number of candidate defects, a number of candidate nets that cause a defect, a number of failing bits, suspect scores, suspect types, number of symptoms, number of suspects per symptom, suspect layers, suspect bounding box shapes, number of failing/passing patterns, indices of failing/passing patterns (e.g., which patterns are failing/passing), and more.

Diagnosis reports produced specifically for a given root cause $c_1$ may exhibit common characteristics among each other as being generated from a common root cause (even with differing forms of injected defects attributable to the root cause $c_1$). Such diagnosis reports for a given root cause $c_1$ may also exhibit distinguishing characteristics from diagnosis reports produced for a different root cause $c_2$. Although $P_O(r|c_n)$ as generated by the local phase of a volume diagnosis procedure may be inaccurate (at least in part), the computed probability distributions (e.g., the training probability distributions 230) may nonetheless encapsulate the above-described common and distinguishing characteristics with respect to differing root causes, and may thus serve as a useful input feature to train the supervised learning model 250.

In some implementations, the model training engine 108 may train the supervised learning model 250 as a linear model for determination of the probabilities $P_A(r|c_n)$. In other implementations, the model training engine 108 may train the supervised learning model 250 as a complex model (e.g., non-linear), though such training may require additional training data. For linear models, the model training engine 108 may determine $P_A(r|c_n)$ for each root cause $c_n$ using a linear function of the values $P_O(r|c_n)$. This can be succinctly represented as:

$$P_A = A * P_O$$

Where N represents the total number of root causes (e.g., as discussed above as a training parameter in creating the training dies 210 and which may vary based on different circuit designs). Moreover, $P_A$ and $P_O$ may take the form of vectors of dimension N (each dimension specifying the probability for a particular root cause $c_n$), and the model training engine 108 may implement the supervised learning model 250 to represent A as an N×N matrix. In some instances, the model training engine 108 may require that all entries in A be non-negative. Doing so may ensure that each entry in $P_A$ will be non-negative, since each entry in $P_O$ represents a probability (and is therefore non-negative).

As used herein, a training data sample may refer to an instance of data in the training set 240, whether it be a labeled training probability distribution in some examples or a labeled diagnostic report in other examples. In the training set 240, each training data sample (e.g., each training probability distribution or each diagnosis report) is labeled by an actual root cause of the defect injected into a corresponding training die. Matrix A, as learned by the supervised learning model 250, can be applied to every training probability distribution or diagnosis report in the training set 240. In learning the matrix A, the model training engine 108 may configure the supervised ML training to increase $P_A(r|c_{inj})$ (e.g., as high as possible) for an actually-injected root cause $c_{inj}$ for a given data sample and decrease $P_A(r|c_{non\_inj})$ (e.g., as low as possible) if root cause $c_{non\_inj}$ is not the injected root cause for a given data sample.

To do so, the model training engine 108 may maximize the ratio of $P_A(r|c_{inj})$ and the sum of $P_A(r|c)$ for all root causes c. However, maximizing this ratio for training data samples (e.g., training probability distributions or diagnosis reports) attributable to a given root cause (e.g., $Open_{M1}$) can make this ratio unfeasible or inaccurate for training data samples attributable to a different root cause (e.g., $Open_{M2}$). Accordingly, the model training engine 108 may consider the entirety of the training data samples included in the training set 240 for the various injected root cause populations. Put another way, the model training engine 108 may apply supervised ML algorithms to simultaneously or collectively account for the entirety of the training set 240 (together for multiple different root causes), instead of on an individual-root cause basis.

One possibility for such a process is to utilize an objective function $f(A)$ that represents the ratio as applied to the entirety of the training set 240, and then maximize the objective function $f(A)$. An implementation of such an objective function is one that sums up this ratio for all of the training set 240. Such a sum-based approach, however, may produce sub-optimal results. To illustrate, two training probability distributions (as computed from diagnosis reports) may have ratios as $R_1$ and $R_2$. Example ratio values of $R_1=1$ and $R_2=0$ will yield a higher sum for the objective function value than $R_1=0.5$ and $R_2=0.49$. However, such an objection function would skew much higher to the injected root cause or defect attributable for $R_1$, and perhaps (completely) ignore the injected root cause or defect attributable for $R_2$. In some implementations, the model training engine 108 may instead use an objective function $f(A)$ that maximizes the product of the ratio for the training set 240. Conceptually, a product-based objective function may be similar to maximizing the likelihood of all the data.

In training the supervised learning model 250, the model training engine 108 may account for training data size. If the number of training probability distributions (or diagnosis reports) differs among labeled root causes, the learned matrix A may be biased towards a given root cause with a relatively larger number of training data samples in the training set 240 (whether training probability distributions 230 or diagnosis reports 220). To address potential biasing, the model training engine 108 may weight training data samples in the training set 240, e.g., to provide equal emphasis for each given root cause or according to any other selected weighting scheme. In some implementations, the model training engine 108 may weight each training data sample (training probability distribution or diagnosis report) of a given root cause with a weight value that is inversely proportional to the total number of training data samples for the given root cause. Note that, in such an example, each training data sample that is labeled with the same injected root cause will have the same weight. For instance, $w_n$ may refer to the weight applied to training data samples belonging to the $n^{th}$ root cause. In such cases, $w_n$ may be represented as:

$$w_n = \frac{1}{S_n}$$

where $S_n$ is the number of training data samples in the training set 240 for the $n^{th}$ root cause. Based on the above, the model training engine 108 may represent the objective function $f(A)$ in the following form:

$$f(A) = \prod_{n=1}^{N} \prod_{i=1}^{S_n} \left( \frac{P_A(r_{ni} | c_n)}{\sum_{m=1}^{N} P_A(r_{ni} | c_m)} \right)^{w_n} =$$

$$\prod_{n=1}^{N} \prod_{i=1}^{S_n} \left( \frac{\sum_{j=1}^{N} A_{nj} \cdot P_O(r_{ni} | c_j)}{\sum_{m=1}^{N} \sum_{j=1}^{N} A_{mj} \cdot P_O(r_{ni} | c_j)} \right)^{w_n}$$

where the first product goes over all the root causes, and the second product goes over all the diagnosis reports present in population $S_n$. In this example, $r_{ni}$ may represent the $i^{th}$ training data sample in population $S_n$ and $A_{nj}$ may represent the entry in the $j^{th}$ column of the $n^{th}$ row of matrix A. Also, $f(A)$ may represent the value of the objective function evaluated at the matrix A. As such, the model training engine 108 may determine (e.g., learn) the matrix A that maximizes the objective function $f(A)$.

To maximize the objective function $f(A)$ to learn the matrix A, the model training engine 108 may use any combination of optimizer or optimization algorithms, such as the L-BFGS-B algorithm. In effect, the matrix A learned through supervised ML techniques may perform a linear adjustment to probability distributions computed via the local phase of a volume diagnosis procedure, doing so accounting for defect distribution probabilities learned from labeled training sets.

As described above, the model training engine 108 may train the supervised learning model 250 as a linear classifier that uses a learned matrix A to adjust the local phase output of volume diagnosis algorithms. In that regard, the matrix A may be referred to as an adjustment matrix that converts local phase outputs into a determined probability value (e.g., $P_A$) that maximizes probabilities for actual injected root causes, as learned from the training set 240 by the supervised learning model 250. While the matrix A provides one implementation example, the model training engine 108 may train the supervised learning model 250 in various other ways to adjust local phase outputs of volume diagnosis procedures. Other examples include logical regression or other supervised ML classification techniques.

The supervised learning model 250 may, in effect, characterize local phase behavior of volume diagnosis procedures and tune such behavior based on supervised ML learning from labeled training sets. By doing so, the supervised learning model 250 may adjust probability distributions computed from local phases of volume diagnosis procedures into adjusted probability distributions to increase the accuracy of root cause determinations. The supervised learning model 250 may be applied to analyze manufactured circuits, which may result in more accurate root cause distribution determinations and increases in circuit manufacture yields. Example features in applying a trained supervised learning model 250 are described next with reference to FIG. 3.

Figure 3:
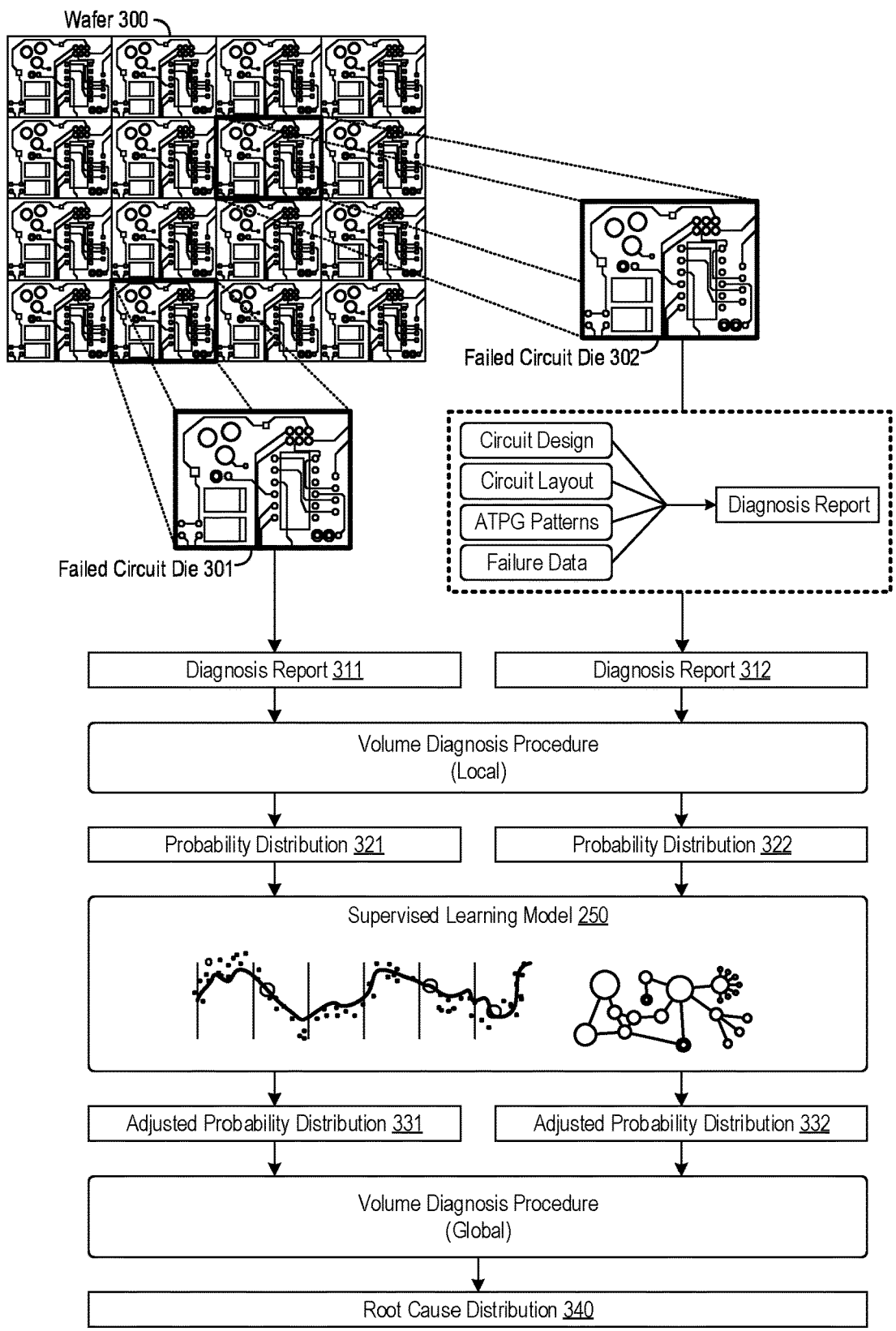
FIG. 3 shows an example application of a trained supervised learning model to adjust local phase outputs of a volume diagnosis procedure.

FIG. 3 shows an example application of a trained supervised learning model to adjust local phase outputs of a volume diagnosis procedure. The model application features depicted in FIG. 3 are described as being performed by the volume diagnosis adjustment engine 110 as one particular example, though other implementations are possible.

In FIG. 3, a manufactured wafer 300 is shown that includes multiple circuit dies. Via testing (e.g., ATPG patterns and scan testing), failed circuit dies 301 and 302 are identified. The failed circuit dies 301 and 302 may be part of a population of failed circuit dies, e.g., as identified from the wafer 300 or a manufacturing run for a given circuit design. The volume diagnosis adjustment engine 110 may support analysis of the failed circuit dies 301 and 302 in determining root causes that resulted in scan test failures for the failed circuit dies 301 and 302. In that regard, the volume diagnosis adjustment engine 110 may apply a supervised learning model 250 to adjust local phase outputs of a volume diagnosis algorithm and increase the accuracy at which root cause distributions are determined for a failed circuit population that includes the failed circuit dies 301 and 302.

In doing so, the volume diagnosis adjustment engine 110 may implement or perform the local phase of a volume diagnosis procedure and adjust the output accordingly using the supervised learning model 250. To illustrate through FIG. 3, the volume diagnosis adjustment engine 110 may access (e.g., generate) diagnosis reports for the failed circuit dies 301 and 302, shown in FIG. 3 as the diagnosis reports 311 and 312 respectively. In a manner as consistently described herein, the diagnosis reports 311 and 312 may be layout-aware, and may account for the circuit design, circuit layout, applied ATPG patterns, and failure data for the failed circuit dies 301 and 302. The volume diagnosis adjustment engine 110 may also compute, through a local phase of the volume diagnosis procedure, probability distributions 321 and 322 for the failed circuit dies 301 and 302, doing so from the diagnosis reports 311 and 312. The probability distributions 321 and 322 may specify probabilities for different root causes as having caused the failed circuit dies 301 and 302 to fail and may represent the local phase output of the volume diagnosis procedure.

The volume diagnosis adjustment engine 110 may adjust the probability distributions 321 and 322 via the supervised learning model 250. For implementations of the supervised learning model 250 that utilize a learned matrix A, the volume diagnosis adjustment engine 110 may linearly adjust the probability distributions 321 and 322 by multiplying each computed probability distribution by the learned matrix A. Other transformations, tuning, or adjustment functions can be implemented by the supervised learning model 250 and applied to the probability distributions 321 and 322 accordingly. In such a manner, the volume diagnosis adjustment engine 110 may generate the adjusted probability distributions 331 and 332. The adjusted probability distributions 331 and 332 may, in effect, be $P_A$, the estimated probabilities learned by the supervised learning model 250 for a given diagnosis report r or input probability distribution $P_O$. As such, the adjusted probability distributions 331 and 332 may respectively take the form of a vector with N number of adjusted probabilities, one for each predetermined root cause selected for the circuit design of the failed circuit dies 301 and 302.

In such a way, the volume diagnosis adjustment engine 110 may adjust local phase outputs of the volume diagnosis procedure via the supervised learning model 250. As noted herein, by increasing the accuracy of $P(r|c_n)$, the supervised learning model 250 may increase the overall accuracy of root cause distributions computed via a global phase of the volume diagnosis procedure. Subsequently, the volume diagnosis adjustment engine 110 may provide the adjusted probability distributions 331 and 332 for the failed circuit dies 301 and 302 as an input to a global phase of the volume diagnosis procedure. In some instances, the volume diagnosis adjustment engine 110 further performs the global phase of the volume diagnosis procedure to determine a global root cause distribution for multiple failed circuit dies, e.g., shown as the root cause distribution 340 in FIG. 3.

Figure 4:
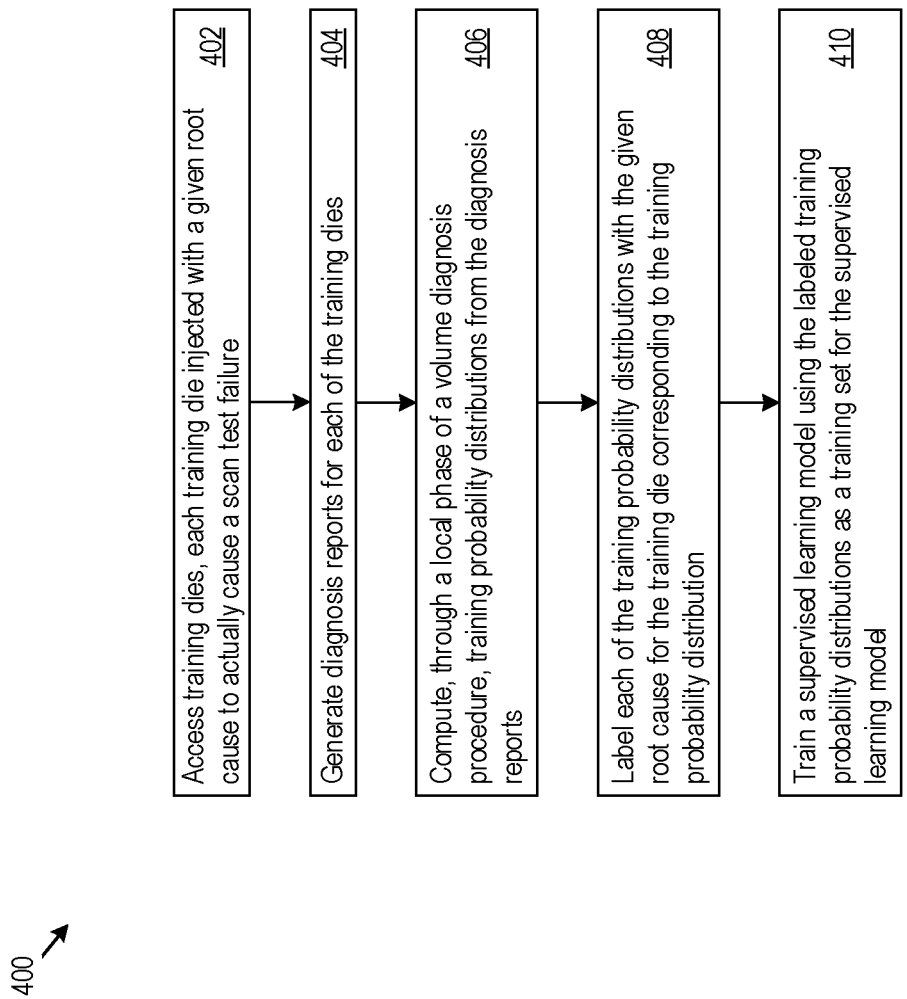
FIG. 4 shows an example of logic that a system may implement to train a supervised learning model to adjust local phase outputs of a volume diagnosis procedure.

FIG. 4 shows an example of logic 400 that a system may implement to train a supervised learning model to adjust local phase outputs of a volume diagnosis procedure. In some examples, the computing system 100 may implement the logic 400 as hardware, executable instructions stored on a machine-readable medium, or as a combination of both. The computing system 100 may implement the logic 400 via the model training engine 108, for example, through which the computing system 100 may perform or execute the logic 400 as a method to support supervised ML-based adjustments to volume diagnosis procedures for determination of root cause distributions in circuit manufacture. However, other implementation options are possible.

In implementing the logic 400, the model training engine 108 may train a supervised learning model with a training set comprising training probability distributions computed for training dies through a local phase of a volume diagnosis procedure. In the training set, each given training probability distribution may specify probabilities for different root causes as having caused a given training die to fail as computed by the volume diagnosis procedure and each given training probability distribution may be labeled with an actual root cause that caused the given training die to fail.

To train the supervised learning model, the model training engine 108 may access the training dies, and each training die may be injected with a given root cause to actually cause a scan test failure (402). The training dies may be generated via simulation, emulation, or a combination of both. The model training engine 108 may further generate diagnosis reports for each of the training dies (404) and compute, through the local phase of a volume diagnosis procedure, the training probability distributions from the diagnosis reports (406). Each of the computed training probability distributions may respectively correspond to one of the training dies. Moreover, the model training engine 108 may label each of the training probability distributions with the given root cause for the training die corresponding to the training probability distribution (408), and the given root cause may be indicative of the actual root cause for the training probability distribution. Then, the model training engine 108 may provide, as the training set, the labeled training probability distributions to train the supervised learning model (410).

As described above, the model training engine 108 may train the supervised learning model using any number or combination of supervised ML algorithms. For instance, the model training engine 108 may train the supervised learning model to include a linear function that linearly adjusts probability distributions computed for failed circuit dies. The linear function may include an adjustment matrix (e.g., learned matrix A described herein) that linearly adjusts an input probability distribution. As such, the adjustment matrix may have dimensions of 'N'×'N', where 'N' is the number of different root causes in probability distributions computed by the local phase of a volume diagnosis procedure. Other implementations of the supervised learning model are contemplated herein as well.

Figure 5:
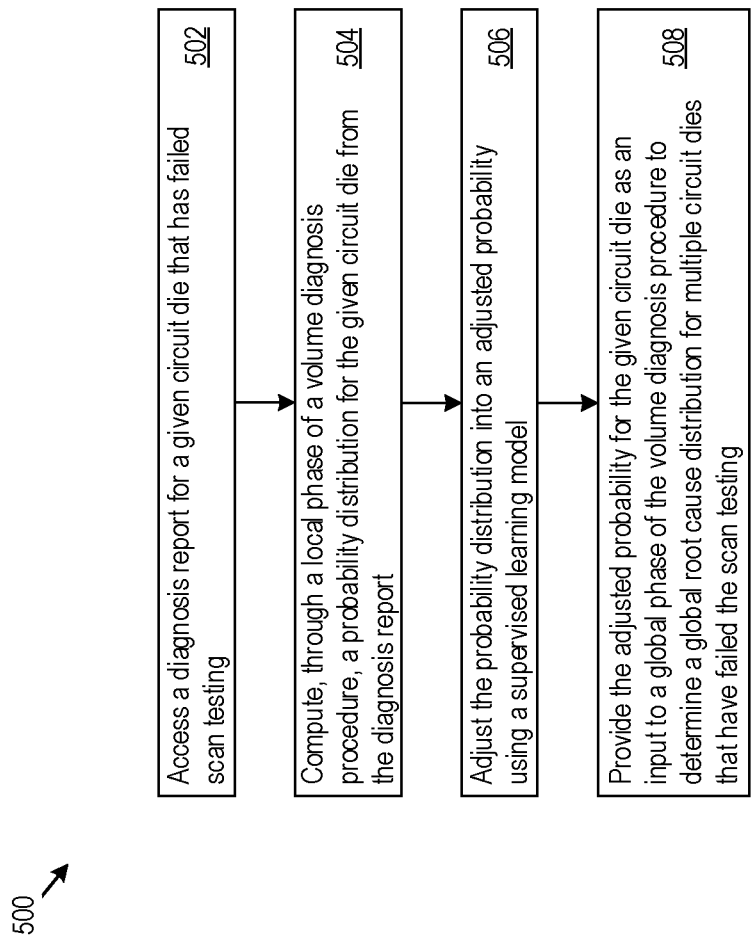
FIG. 5 shows an example of logic that a system may implement to apply a trained supervised learning model to adjust local phase outputs of a volume diagnosis procedure.

FIG. 5 shows an example of logic 500 that a system may implement to apply a trained supervised learning model to adjust local phase outputs of a volume diagnosis procedure. In some examples, the computing system 100 may implement the logic 500 as hardware, executable instructions stored on a machine-readable medium, or as a combination of both. The computing system 100 may implement the logic 500 via the volume diagnosis adjustment engine 110, for example, through which the computing system 100 may perform or execute the logic 500 as a method to support supervised ML-based adjustments to volume diagnosis procedures for determination of root cause distributions in circuit manufacture. However, other implementation options are possible.

In implementing the logic 500, the volume diagnosis adjustment engine 110 may access a diagnosis report for a given circuit die that has failed scan testing (502) and compute, through a local phase of a volume diagnosis procedure, a probability distribution for the given circuit die from the diagnosis report (504). The probability distribution may specify probabilities for different root causes as having caused the given circuit die to fail. Then, the volume diagnosis adjustment engine 110 may adjust the probability distribution into an adjusted probability distribution using a supervised learning model (506), and the supervised learning model may be trained with a training set comprising training probability distributions computed from training dies through the local phase of the volume diagnosis procedure, each training probability distribution labeled with an actual root cause that caused a given training die to fail. The volume diagnosis adjustment engine 110 may further provide the adjusted probability distribution for the given circuit die as an input to a global phase of the volume diagnosis procedure to determine a global root cause distribution for multiple circuit dies that have failed the scan testing (508).

While example ML-based volume diagnosis adjustment features are shown and described through FIGS. 4 and 5, the logic 400 and 500 may include any number of additional or alternative steps as well. The logic 400 and 500 may additionally or alternatively implement any other ML-based volume diagnosis adjustment features described herein, for example any with respect to the model training engine 108, volume diagnosis adjustment engine 110, or combinations of both.

Figure 6:
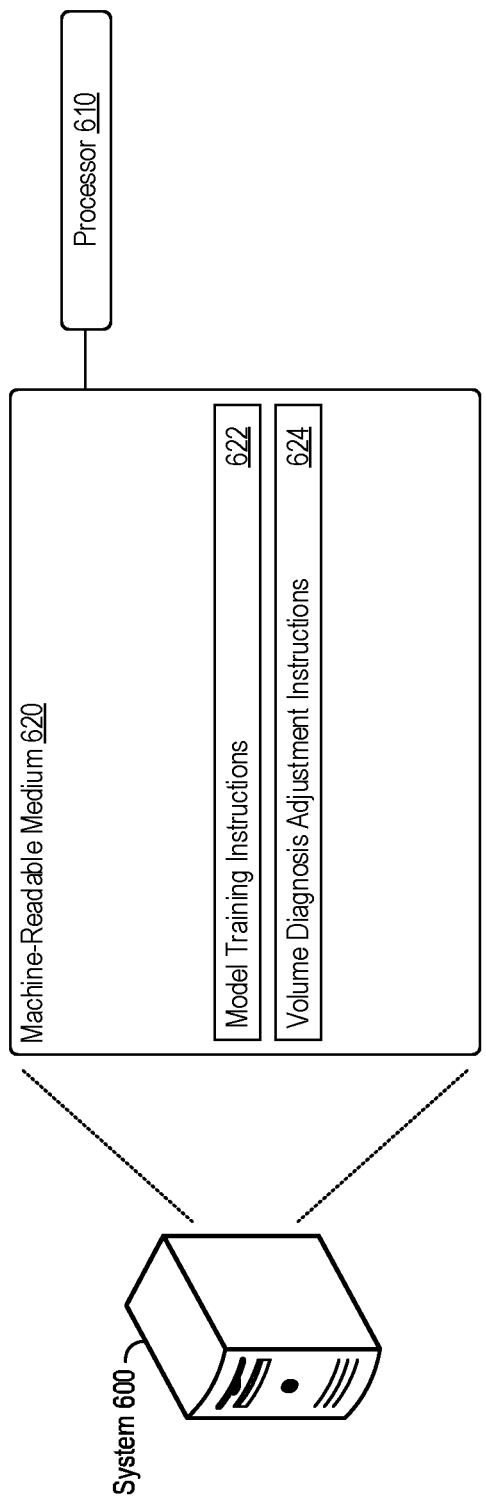
FIG. 6 shows an example of a system that supports supervised ML-based adjustments to volume diagnosis procedures for determination of root cause distributions in circuit manufacture.

FIG. 6 shows an example of a system 600 that supports supervised ML-based adjustments to volume diagnosis procedures for determination of root cause distributions in circuit manufacture. The system 600 may include a processor 610, which may take the form of a single processor or multiple processors. The processor(s) 610 may include a central processing unit (CPU), microprocessor, or any hardware device suitable for executing instructions stored on a machine-readable medium. The system 600 may include a machine-readable medium 620. The machine-readable medium 620 may take the form of any non-transitory electronic, magnetic, optical, or other physical storage device that stores executable instructions, such as the model training instructions 622 and the volume diagnosis adjustment instructions 624 shown in FIG. 6. As such, the machine-readable medium 620 may be, for example, random access memory (RAM) such as a dynamic RAM (DRAM), flash memory, spin-transfer torque memory, an electrically-erasable programmable read-only memory (EEPROM), a storage drive, an optical disk, and the like.

The system 600 may execute instructions stored on the machine-readable medium 620 through the processor 610. Executing the instructions may cause the system 600 to perform any of the ML-based volume diagnosis adjustment features described herein, including according to any of the features of the model training engine 108, the volume diagnosis adjustment engine 110, combinations of both.

For example, execution of the model training instructions 622 by the processor 610 may cause the system 600 to train a supervised learning model with a training set comprising training data samples generated from training dies, each training data sample labeled with an actual root cause that caused a given training die to fail. For instance, the training data samples may comprise training probability distributions computed for training dies through a local phase of a volume diagnosis procedure, wherein each given training probability distribution specifies probabilities for different root causes as having caused a given training die to fail as computed by the volume diagnosis procedure and each given training probability distribution may be labeled with an actual root cause that caused the given training die to fail. Training data samples additionally or alternatively comprised of of other input features (e.g., not based on training probability distributions) are also contemplated herein.

Execution of the volume diagnosis adjustment instructions 624 may cause the system 600 to access a diagnosis report for a given circuit die that has failed scan testing; compute, through a local phase of a volume diagnosis procedure, a probability distribution for the given circuit die from the diagnosis report, wherein the probability distribution specifies probabilities for different root causes as having caused the given circuit die to fail; adjust the probability distribution into an adjusted probability distribution using a supervised learning model, the supervised learning model trained with a training set of training data samples generated from training dies, each training data sample labeled with an actual root cause that caused a given training die to fail; and provide the adjusted probability distribution for the given circuit die as an input to a global phase of the volume diagnosis procedure to determine a global root cause distribution for multiple circuit dies that have failed the scan testing.

The systems, methods, devices, and logic described above, including the model training engine 108 and the volume diagnosis adjustment engine 110, may be implemented in many different ways in many different combinations of hardware, logic, circuitry, and executable instructions stored on a machine-readable medium. For example, the model training engine 108, volume diagnosis adjustment engine 110, or both, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the model training engine 108, the volume diagnosis adjustment engine 110, or combinations of both.

The processing capability of the systems, devices, and engines described herein, including the model training engine 108 and the volume diagnosis adjustment engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
accessing a diagnosis report for a given circuit die that has failed scan testing;
computing, through a local phase of a volume diagnosis procedure, a probability distribution for the given circuit die from the diagnosis report, wherein the probability distribution specifies probabilities for different suspect root causes as having caused the given circuit die to fail;
adjusting the probability distribution into an adjusted probability distribution using a supervised learning model, including by, through the supervised learning model, changing at least one of the probabilities for the different suspect root causes specified in the probability distribution as having caused the given circuit die to fail through the supervised learning model, the supervised learning model trained with a training set comprising training probability distributions of suspect root causes computed from training dies through the local phase of the volume diagnosis procedure, the training dies injected with particular root causes that cause the training dies to fail, and each training probability distribution of suspect root causes of the training set labeled with an actual root cause, wherein the actual root cause specifies the particular root cause injected into a given training die that caused the given training die to fail;
providing the adjusted probability distribution for the given circuit die as an input to a global phase of the volume diagnosis procedure to determine a global root cause distribution for multiple circuit dies that have failed the scan testing;
performing the global phase of the volume diagnosis procedure using, as inputs, a plurality of adjusted probability distributions from the multiple circuit dies that have failed the scan testing, including the adjusted probability distribution for the given circuit die adjusted through the supervised learning model; and:
generating the supervised learning model, including by accessing the training dies, wherein each training die has been injected with a respective specific root cause to actually cause a scan test failure;
generating diagnosis reports for each of the training dies;
computing, through the local phase of a volume diagnosis procedure, the training probability distributions of suspect root causes from the diagnosis reports generated for the training dies, each of the training probability distributions of suspect root causes respectively corresponding to one of the training dies;

labeling each of the training probability distributions of suspect root causes with the respective specific root cause for the training die corresponding to the training probability distribution of suspect root causes, wherein the respective specific root cause specifies the actual root cause injected into the training die to cause the training die to fail; and providing, as the training set, the labeled training probability distributions to train the supervised learning model.

2. The method of claim 1, wherein the volume diagnosis procedure utilizes an unsupervised learning model to compute the probability distribution for the given circuit die, determine the global root cause distribution for multiple circuit dies, or both.

3. The method of claim 1, wherein the global phase of the volume diagnosis procedure is performed using a root cause deconvolution (RCD) model.

4. The method of claim 1, wherein the training dies are generated via simulation, emulation, or a combination of both.

5. The method of claim 1, wherein the supervised learning model comprises a linear function that linearly adjusts the probability distribution computed for the given circuit die.

6. The method of claim 5, wherein the linear function comprises an adjustment matrix that linearly adjusts an input probability distribution; and wherein the adjustment matrix has dimensions of 'N'× 'N', wherein 'N' is a number of different root causes in probability distributions computed by the local phase of a volume diagnosis procedure.

7. A system comprising:

a model training engine, comprising hardware and programming, configured to train a supervised learning model with a training set comprising training probability distributions of suspect root causes computed for training dies through a local phase of a volume diagnosis procedure, the training dies intentionally injected with root causes that cause the training dies to fail, wherein:

each given training probability distribution of suspect root causes specifies probabilities for different suspect root causes as having caused a given training die to fail as computed by the volume diagnosis procedure; and each given training probability distribution of suspect root causes is labeled with an actual root cause wherein the actual root cause specifies a particular root cause injected into the given training die that caused the given training die to fail, and wherein the model training engine is configured to train the supervised learning model by:

accessing the training dies, wherein each training die has been injected with a respective specific root cause to actually cause a scan test failure;

generating diagnosis reports for each of the training dies;

computing, through the local phase of a volume diagnosis procedure, the training probability distributions of suspect root causes from the diagnosis reports generated for the training dies, each of the training probability distributions of suspect root causes respectively corresponding to one of the training dies;

labeling each of the training probability distributions of suspect root causes with the respective specific root cause for the training die corresponding to the training probability distribution of suspect root causes, wherein the respective specific root cause specifies the actual root cause injected into the training die to cause the training die to fail; and providing, as the training set, the labeled training probability distributions to train the supervised learning model; and a volume diagnosis adjustment engine, comprising hardware and programming, configured to:

access a diagnosis report for a given circuit die that has failed scan testing;

compute, through the local phase of the volume diagnosis procedure, a probability distribution for the given circuit die from the diagnosis report, wherein the probability distribution specifies probabilities for different suspect root causes as having caused the given circuit die to fail;

adjust the probability distribution into an adjusted probability distribution using the supervised learning model including by, through the supervised learning model, changing at least one of the probabilities for the different suspect root causes specified in the probability distribution as having caused the given circuit die;

provide the adjusted probability distribution for the given circuit die as an input to a global phase of the volume diagnosis procedure to determine a global root cause distribution for multiple circuit dies that have failed the scan testing; and perform the global phase of the volume diagnosis procedure using, as inputs, a plurality of adjusted probability distributions from the multiple circuit dies that have failed the scan testing, including the adjusted probability distribution for the given circuit die adjusted through the supervised learning model.

8. The system of claim 7, wherein the volume diagnosis procedure utilizes an unsupervised learning model to compute the probability distribution for the given circuit die, determine the global root cause distribution for multiple circuit dies, or both.

9. The system of claim 7, wherein the global phase of the volume diagnosis procedure is performed using a root cause deconvolution (RCD) model.

10. The system of claim 7, wherein the training dies are generated via simulation, emulation, or a combination of both.

11. The system of claim 7, wherein the supervised learning model comprises a linear function that linearly adjusts the probability distribution computed for the given circuit die.

12. The system of claim 11, wherein the linear function comprises an adjustment matrix that linearly adjusts an input probability distribution; and wherein the adjustment matrix has dimensions of 'N'× 'N', wherein 'N' is a number of different root causes in probability distributions computed by the local phase of a volume diagnosis procedure.

13. A non-transitory machine-readable medium comprising instructions that, when executed by a processor, cause a computing system to:

access a diagnosis report for a given circuit die that has failed scan testing;

compute, through a local phase of a volume diagnosis procedure, a probability distribution for the given circuit die from the diagnosis report, wherein the probability distribution specifies probabilities for different suspect root causes as having caused the given circuit die to fail;

adjust the probability distribution into an adjusted probability distribution using a supervised learning model, including by, through the supervised learning model, changing at least one of the probabilities for the different suspect root causes specified in the probability distribution as having caused the given circuit die to fail through the supervised learning model, the supervised learning model trained with a training set comprising training probability distributions of suspect root causes computed from training dies through the local phase of the volume diagnosis procedure, the training dies injected with particular root causes that cause the training dies to fail, and each training probability distribution of suspect root causes of the training set labeled with an actual root cause, wherein the actual root cause specifies the particular root cause injected into a given training die that caused the given training die to fail;

provide the adjusted probability distribution for the given circuit die as an input to a global phase of the volume diagnosis procedure to determine a global root cause distribution for multiple circuit dies that have failed the scan testing;

perform the global phase of the volume diagnosis procedure using, as inputs, a plurality of adjusted probability distributions from the multiple circuit dies that have failed the scan testing, including the adjusted probability distribution for the given circuit die adjusted through the supervised learning model; and generate the supervised learning model, including by:
    accessing the training dies, wherein each training die has been injected with a respective specific root cause to actually cause a scan test failure;
    generating diagnosis reports for each of the training dies;
    computing, through the local phase of a volume diagnosis procedure, the training probability distributions of suspect root causes from the diagnosis reports generated for the training dies, each of the training probability distributions of suspect root causes respectively corresponding to one of the training dies;
    labeling each of the training probability distributions of suspect root causes with the respective specific root cause for the training die corresponding to the training probability distribution of suspect root causes, wherein the respective specific root cause specifies the actual root cause intentionally injected into the training die to cause the training die to fail; and
    providing, as the training set, the labeled training probability distributions to train the supervised learning model.

14. The non-transitory machine-readable medium of claim 13, wherein the volume diagnosis procedure utilizes an unsupervised learning model to compute the probability distribution for the given circuit die, determine the global root cause distribution for multiple circuit dies, or both.

15. The non-transitory machine-readable medium of claim 13, wherein the training dies are generated via simulation, emulation, or a combination of both.

16. The non-transitory machine-readable medium of claim 13, wherein the supervised learning model comprises a linear function that linearly adjusts the probability distribution computed for the given circuit die.

17. The non-transitory machine-readable medium of claim 16, wherein the linear function comprises an adjustment matrix that linearly adjusts an input probability distribution; and wherein the adjustment matrix has dimensions of 'N'× 'N', wherein 'N' is a number of different root causes in probability distributions computed by the local phase of a volume diagnosis procedure.

\* \* \* \* \*